(12) United States Patent
Huang et al.

(10) Patent No.: US 9,450,402 B1
(45) Date of Patent: Sep. 20, 2016

(54) ELECTROSTATIC DISCHARGE PROTECTION CIRCUITRY WITH REDUCED CAPACITANCE

(71) Applicant: Altera Corporation, San Jose, CA (US)

(72) Inventors: Cheng-Hsiung Huang, Cupertino, CA (US); Kyle Bowers, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 197 days.

(21) Appl. No.: 13/903,901

(22) Filed: May 28, 2013

(51) Int. Cl.
 *H02H 9/04* (2006.01)
(52) U.S. Cl.
 CPC ..................... *H02H 9/041* (2013.01)
(58) Field of Classification Search
 CPC ............ H02H 9/046; H01L 21/28114; H01L 21/823462; H01L 21/823857; H01L 27/0251; H01L 27/0255; H01L 27/0262; H01L 27/0266; H01L 29/7835; H01L 29/42368; H01L 29/66659
 USPC ............................................. 361/56; 257/101
 See application file for complete search history.

(56) References Cited

U.S. PATENT DOCUMENTS

| | | | | |
|---|---|---|---|---|
| 5,514,939 A | * | 5/1996 | Schlager et al. | 318/400.09 |
| 6,046,474 A | * | 4/2000 | Oh et al. | 257/343 |
| 6,433,392 B1 | * | 8/2002 | Amerasekera | H01L 27/0262 257/355 |
| 7,271,989 B2 | | 9/2007 | Huang et al. | |
| 7,978,450 B1 | * | 7/2011 | Perisetty | 361/56 |
| 8,941,181 B2 | * | 1/2015 | Nandakumar et al. | 257/355 |
| 2006/0237792 A1 | * | 10/2006 | Glenn et al. | 257/355 |

OTHER PUBLICATIONS

Jensen et al., U.S. Appl. No. 13/708,556, filed Dec. 7, 2012.
Chu et al., U.S. Appl. No. 12/405,143, filed Mar. 16, 2009.
Jensen et al., U.S. Appl. No. 12/910,416, filed Oct. 22, 2010.

* cited by examiner

*Primary Examiner* — Thienvu Tran
*Assistant Examiner* — Kevin J Comber
(74) *Attorney, Agent, or Firm* — Treyz Law Group; Jason Tsai; Vineet Dixit

(57) ABSTRACT

Integrated circuits with electrostatic discharge (ESD) protection circuitry are provided. Integrated circuits may include input-output pins that are coupled to the ESD protection circuitry. The ESD protection circuitry may include diode circuits, a control circuit, and a power clamp circuit. Each diode circuit may have a first terminal that is coupled to a respective input-output pin and a second terminal that is coupled to a shared ESD control line. The control circuit may supply a boosted voltage onto the control line to reverse bias the diode circuits during normal operation while the power clamp is turned off. During an ESD event, the power clamp may be turned on to sink current from the diode circuits. The power clamp may include a transistor having a substrate that is forward biased to improve transistor drive strength during the ESD event and that is reverse biased to reduce leakage during normal operation.

20 Claims, 9 Drawing Sheets

ELECTROSTATIC DISCHARGE PROTECTION CIRCUITRY WITH REDUCED CAPACITANCE

BACKGROUND

This invention relates to integrated circuits and more particularly, to integrated circuits with electrostatic discharge protection circuitry.

Integrated circuits are often exposed to potentially damaging electrostatic charge. For example, a wafer of integrated circuit dies may be exposed to electric charge during integrated circuit fabrication. Such charge may arise from the use of plasma etching techniques or other processes that produce charged particles. As another example, an integrated circuit package may be exposed to electrostatic charge when a worker inadvertently touches exposed pins on the integrated circuit package or when the integrated circuit package becomes electrostatically charged due to movement of the package in a tray. Electrostatic charge generated in this way can oftentimes damage sensitive circuitry on an integrated circuit (i.e., transistors and other electrical devices on the integrated circuit can be damaged when exposed to excessive current).

To reduce the impact of electrostatic charge on sensitive circuitry, integrated circuits may be provided with electrostatic discharge (ESD) protection circuitry. Electrostatic discharge protection circuitry is typically coupled to input-output pins on an integrated circuit. As integrated circuit devices scale towards more advanced technology nodes (i.e., 28 nanometers and beyond), ESD requirements may be increased in order to protect smaller transistors from being damaged during fabrication and other device packaging/assembly operations.

One way of satisfying the increasing ESD requirements is to increase the size of the ESD protection circuitry so that more ESD current can be absorbed with the ESD protection circuitry. Upsizing the ESD protection circuitry, however, increases the amount of capacitance at the input-output pins. Increasing capacitive loading at the input-output pins may undesirably limit the high-speed communications performance of an integrated circuit.

SUMMARY

Integrated circuits may include electrostatic discharge (ESD) protection circuitry. ESD protection circuits may be part of input-output driver circuitry that is used to drive signals off-chip and receive signals from external circuitry. For example, an integrated circuit may include input-output buffer circuits that are coupled to input-output pads (sometimes referred to as I/O pins).

An input-output buffer circuit on the integrated circuit may have a first power supply terminal that is coupled to a first power supply line (e.g., a first power supply line on which a positive power supply voltage is provided) and a second power supply terminal that is coupled to a second power supply line (e.g., a second power supply line on which a ground power supply voltage is provided).

The ESD protection circuitry may include at least one ESD diode circuit that is coupled to the input-output buffer circuit. In particular, the ESD diode circuit may have a first terminal that is coupled to the buffer circuit and a second terminal that receives a bias voltage that is greater than the positive power supply voltage.

The ESD protection circuitry may also include an ESD control circuit that supplies the bias voltage to the ESD diode circuit and an ESD power clamp circuit that is coupled between the ESD diode circuit and the ground power supply line. The ESD power clamp may include a transistor (e.g., an n-channel transistor) and an ESD detection circuit. The ESD detection circuit may be configured to turn on the n-channel transistor during an ESD event and to turn off the n-channel transistor during normal operation of the integrated circuit. If desired, the n-channel power clamp transistor may have a bulk terminal that is forward biased during ESD events to improve transistor drive strength and that is reverse biased during normal operation to reduce leakage.

In certain embodiments, the ESD diode circuit and the n-channel transistor in the power clamp circuit may be formed in lightly doped well regions (e.g., the ESD diode circuit and the n-channel power clamp transistor may be formed as "LVT" devices). For example, the integrated circuit may include processing circuitry having n-channel transistors formed in p-wells exhibiting a first dopant concentration and p-channel transistors formed in n-wells exhibiting a second dopant concentration. The ESD diode circuit may be formed in an n-well having a third dopant concentration that is less than the second dopant concentration. The n-channel power clamp transistor may be formed in a p-well having a fourth dopant concentration that is less than the first dopant concentration.

The lower dopant concentration associated with the ESD diode circuits and the ESD power clamp transistor may be formed using counter-doping implant techniques. For example, when forming the n-well of the ESD diode circuit, an n-well that exhibits a given dopant concentration may first be formed by implanting n-type dopants. The given dopant concentration of the n-well may then be reduced by implanting p-type dopants. The amount of p-type dopants is generally less than the n-type dopants so that the n-well remains n-type. Diode (anode and cathode) contact regions may subsequently be formed within the n-well.

As another example, when forming the p-well of the n-channel power clamp transistor, a p-well that exhibits a given dopant concentration may first be formed by implant p-type dopants. The given dopant concentration of the p-well may then be reduced by implanting n-type dopants. The amount of n-type dopants may be less than the p-type dopants so that the p-well of the n-channel transistor remains p-type. Source-drain contact regions may subsequently be formed within the p-well.

Further features of the present invention, its nature and various advantages will be more apparent from the accompanying drawings and the following detailed description.

DETAILED DESCRIPTION

Integrated circuits are often exposed to electrostatic charge. For example, if an assembly line operator inadvertently touches the input-output (I/O) pins of an integrated circuit, sensitive circuitry within the integrated circuit may be exposed to electrostatic charge. Electrostatic charge may also develop during integrated circuit fabrication or during handling. Large currents that develop during an electrostatic discharge event may damage the sensitive circuitry on the integrated circuit. For example, the human body can discharge as much as 1.5 A of current through an I/O pin of an integrated circuit, whereas undesired electrostatic charges developed during processing, testing, handling, and operation can develop as much as 8 A of current through an I/O pin.

This relates to ways of protecting integrated circuits from the undesirable effects of electrostatic discharge, and in particular, to electrostatic discharge (ESD) protection circuitry for preventing sensitive integrated circuit components (e.g., transistors, diodes, resistors, capacitors, inductors, etc.) from being damaged due to exposure to undesirable high voltage and current levels.

Figure 1:
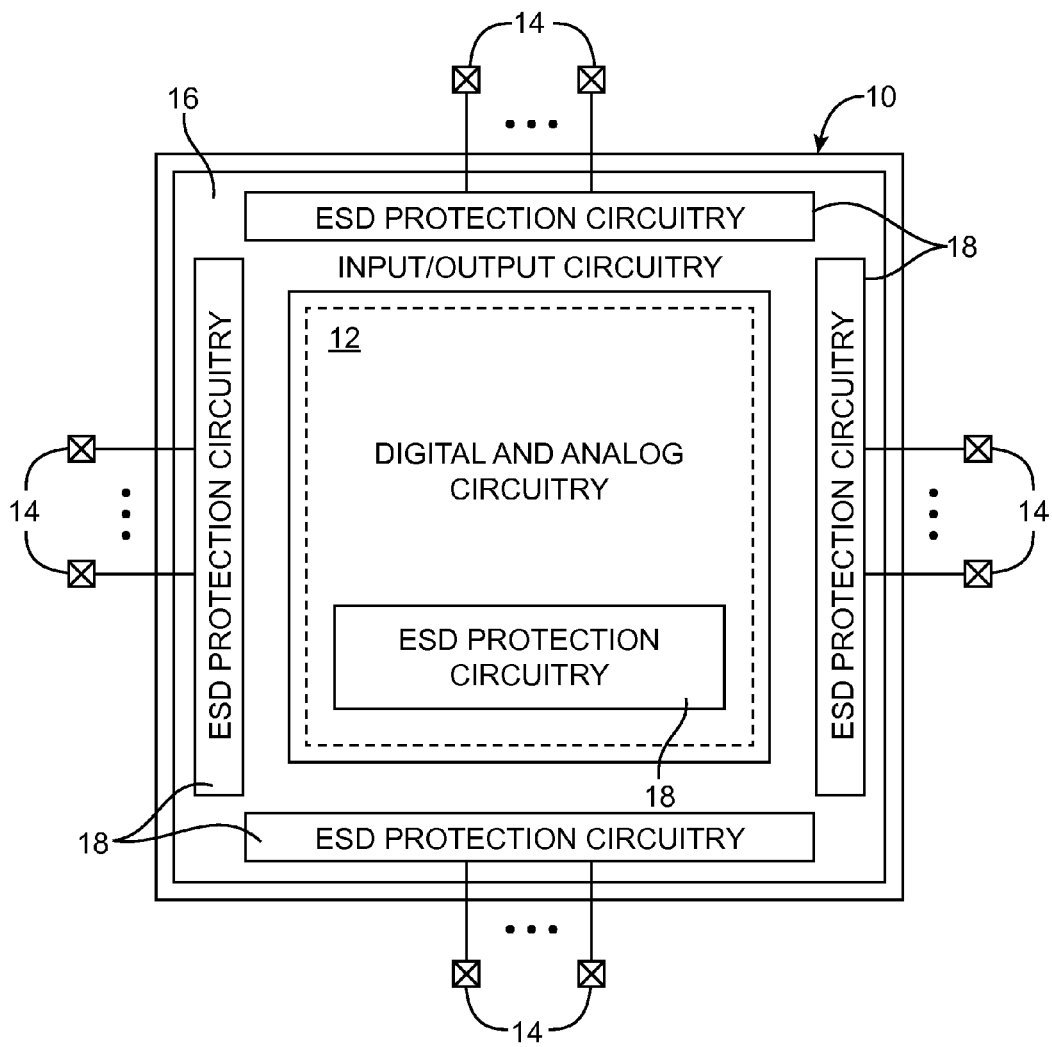
FIG. 1 is a diagram of an illustrative integrated circuit with electrostatic discharge (ESD) protection circuitry in accordance with an embodiment of the present invention.

FIG. 1 shows an integrated circuit that includes digital and analog circuitry 12 and other circuitry formed in a semiconductor substrate. The semiconductor substrate may, for example, be a P-type silicon substrate. Digital and analog circuit 12 may include memory circuitry, logic circuits, arithmetic circuits, and/or other control circuitry that serve to implement the desired function of integrated circuit 10.

Integrated circuit 10 may be a memory chip, a digital signal processor (DSP), a microprocessor, an application specific integrated circuit (ASIC), or a programmable integrated circuit. Examples of programmable integrated circuits include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

As shown in FIG. 1, integrated circuit 10 may include input-output (I/O) circuitry such as I/O circuitry 16 formed along each edge of integrated circuit 10. Circuitry 16 may be used for driving signals off of device 10 and for receiving signals from other devices via I/O pins 14. Each pin 14 may, for example, be connected to a power supply line or a data line on a printed circuit board. Integrated circuit 10 may have any suitable number of input-output pins 14 (which is sometimes referred to as input-output pads or input-output terminals).

Due to interactions with the environment such as inadvertent touching by personnel during manufacturing or assembly operations or due to movement of integrated circuit 10 in a carrier, pads such as pads 14 may become electrostatically charged.

To prevent ESD damage, circuitry 16 may include in additional to input-output buffer circuits and other I/O circuits that allow device 10 to communicate with external circuitry, electrostatic discharge (ESD) protection circuitry such as ESD protection circuitry 18. ESD protection circuitry 18 may serve to limit the amount of electrostatic (noise) current that flows through pads 14. Limiting the amount of current that can flow into device 10 through pads 14 may protect sensitive circuitry (e.g., digital and analog circuitry 12) on device 10 from damage due to electrostatic discharge events. ESD protection circuitry 18 may therefore sometimes be referred to an ESD clamp circuit. As shown in FIG. 1, ESD protection circuitry 18 may also be formed at the core (e.g., near the center and interlaced with circuitry 12) of device 10.

Figure 2:
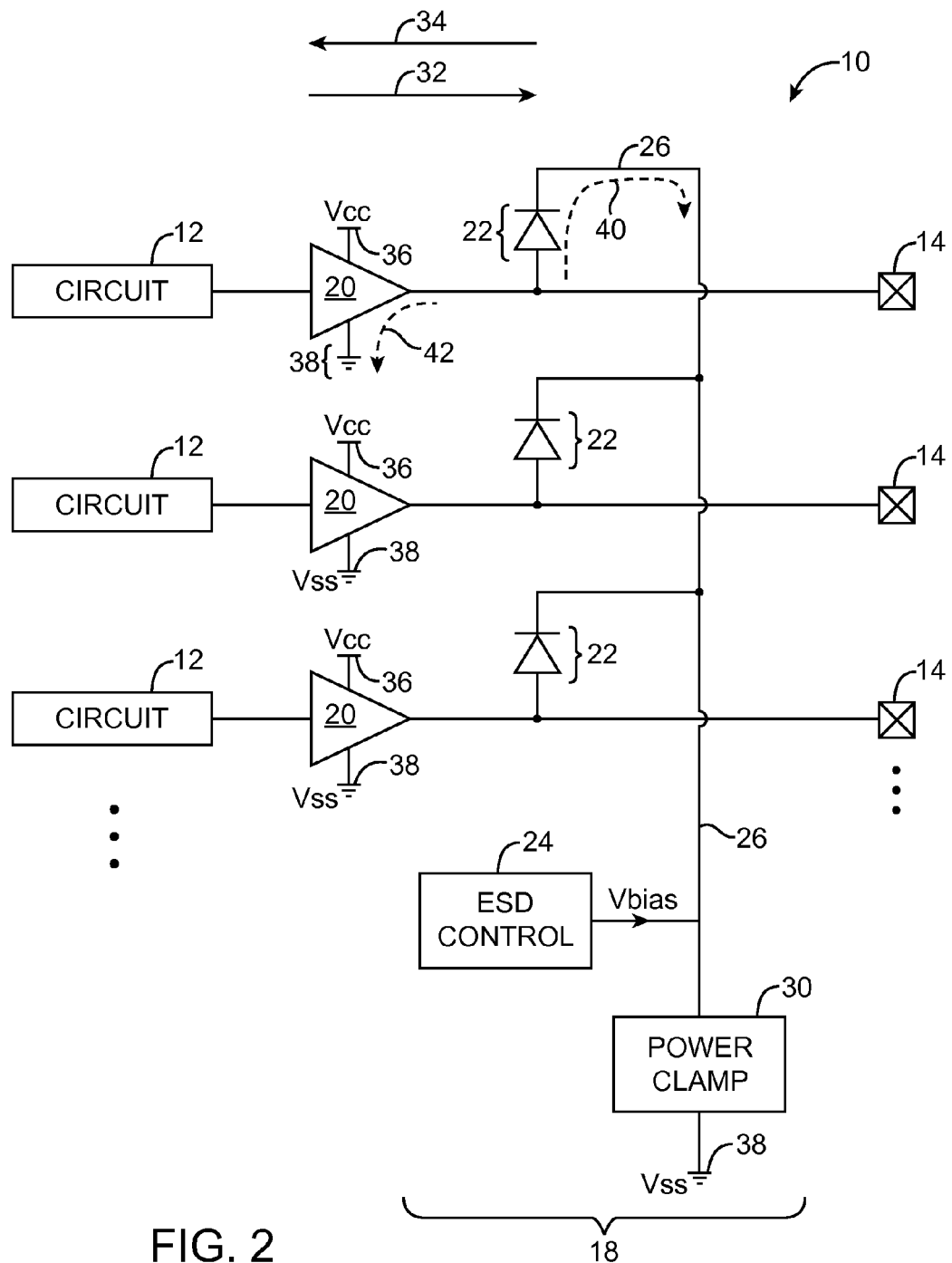
FIG. 2 is a diagram showing electrostatic discharge protection circuitry that is coupled to input-output pins in accordance with an embodiment of the present invention.

FIG. 2 is a diagram showing input-output pads 14 being coupled to ESD protection circuitry 18. As shown in FIG. 2, ESD protection circuitry 18 may include ESD protection diode circuits 22, a control circuit such as ESD control circuit 24, and an ESD power clamp circuit 30. In the example of FIG. 2, circuits 12 represent sensitive internal circuitry on device 10. Each circuit 12 may be coupled to a corresponding I/O pad 14 via a respective output buffer circuit 20. Output buffer circuit 20 may, for example, include at least a p-channel transistor and an re-channel transistor coupled in series between a positive power supply line 36 (e.g., a first power supply line on which positive power supply voltage Vcc is provided) and a ground power supply line 38 (e.g., a second power supply line on which ground power supply voltage Vss is provided).

Each input-output pad 14 may be coupled to a respective diode circuit 22. For example, each diode 22 may have a first (p-type) terminal that is coupled to one of pads 14 and a second (n-type) terminal that is coupled to a common ESD control line 26 (e.g., the first terminals of diodes 22 may be coupled to different pads 14, whereas the second terminals of diodes 22 may be coupled to shared control line 26). Electrostatic discharge control circuit 24 may be used to supply a bias voltage Vbias onto line 26 during normal operation for reducing the capacitance of each diode 22. Line 26 may also be coupled to ground line 38 via power clamp 30.

During an ESD event, electrostatic charge accumulated at an I/O pad 14 can be discharged via the re-channel transistor in the associated output buffer 20 (as indicated by pull-down ESD current path 42) or via the associated diode 22 and power clamp 30 (as indicated by pull-up ESD current path 40). Diodes 22 may therefore sometimes be referred to as pull-up (positive) ESD protection diodes. For example, if during an ESD event the voltage on I/O pad 14 is less than ground, the n-channel transistor in buffer 20 may turn on to discharge the negative ESD charge. As another example, if during an ESD event the voltage on I/O pad 14 exceeds a predetermined threshold, the positive ESD charge may be drained through diode 22 and power clamp 30. Output buffer 20 may therefore sometimes be considered part of ESD protection circuitry 18. ESD protection circuitry 18 operated in this way may be used to prevent circuits 12 from becoming damaged during ESD events.

In designing ESD protection circuitry 18, buffer circuits 20 and diodes 22 should be sized appropriately to be able to handle different amounts of current during ESD events. Upsizing diodes 22 may, however, result in increased capacitance at input-output pads 14. Increased capacitive load levels at pads 14 may undesirably limit high-speed data transmission capabilities via pad 14 (e.g., in applications where device 10 is being used to handle high-speed communications at over 10 Gbps).

In one suitable embodiment, ESD control circuit 24 may supply control signal Vbias on line 26 to reverse bias diodes 22 during normal device operation. Reverse biasing a diode 22 may widen a depletion region associated with that diode, thereby resulting in decreased diode capacitance. During normal operation, signals at the output of buffer circuits 20 are allowed to swing between Vcc and Vss. In this scenario, ESD control circuit 24 may generate Vbias having a voltage level that is greater than Vcc in order to place diodes 22 in reverse bias mode. As examples, Vbias may have a voltage level that is 2*Vcc, 3*Vcc, 10% greater than Vcc, 25% greater than Vcc, or other suitable voltage level greater than Vcc. Reverse biasing ESD diode circuits 22 in this way may therefore allow designers to upsize diodes 22 while keeping the diode capacitance at satisfactory levels.

The example of FIG. 2 is merely illustrative and does not serve to limit the scope of the present invention. Output buffer circuits 20 are shown in FIG. 2 to drive signal off of device 10 in the direction of arrow 32. In general, device 10 may also include input buffer circuits for receiving signals from off-chip sources in the direction of arrow 34 via pads 14 (not shown in FIG. 2 for clarity).

Figure 3:
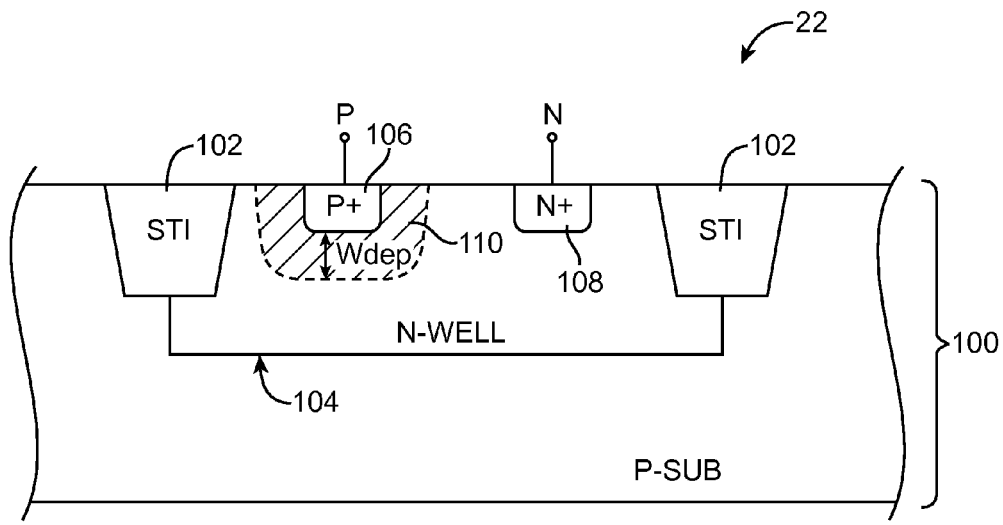
FIG. 3 is a cross-sectional side view of an illustrative ESD diode circuit in accordance with an embodiment of the present invention.

FIG. 3 shows a cross-sectional side view of an illustrative ESD diode circuit 22. As shown in FIG. 3, ESD diode 22 may be formed in a semiconductor substrate such as p-type silicon substrate (P-SUB) 100. Diode 22 may include an n-well 104 that is formed between isolation structures such as shallow trench isolation (STI) structures 102, and a p+ doped region 106 and an n+ doped region 108 that are formed in n-well 104. P+ region 106 may serve as an anode or positive terminal P for diode 22, whereas n+ region 108 may serve as a cathode or negative terminal N for diode 22. Diode 22 configured in this way is sometimes referred to as a p+/n-well diode. This is merely illustrative. In other suitable arrangements, diode 22 may be an n+/p-well diode.

Referring still to FIG. 3, diode 22 may have a depletion region 110 associated with region 106. Depletion region 110 may be a region that is depleted of mobile carriers. Depletion region 110 may have a width Wdep that is adjustable depending on bias voltages applied to the positive and negative terminals of diode 22. As described previously in connection with FIG. 2, depletion region width Wdep may be widened by reverse biasing diode 22 in order to decrease the capacitance associated with diode 22.

In another suitable embodiment, depletion region width Wdep may also be increased by reducing the well doping concentration associated with diode 22. For example, substrate 100 may be doped using p-type dopants (e.g., boron) with dopant concentrations of no more than $10^{14}$ dopant atoms/cm$^3$. Regions of substrate 100 with such low dopant concentrations may be referred to as "native" or substantially undoped substrate regions. Region 106 may have a relatively high p-type dopant concentration of up to $10^{19}$ atoms/cm$^3$, whereas region 108 may have a relatively high n-type dopant concentration of up to $10^{19}$ atoms/cm$^3$.

In conventional devices, n-well regions are doped using n-type dopants to exhibit a concentration of $10^{17}$ dopant atoms/cm$^3$ (as an example). Devices of this type may be referred to as standard doping or "SVT" devices.

In certain embodiments, n-well region 104 may be doped using n-type dopants to exhibit a relatively lower concentration of less than $10^{17}$ dopant atoms/cm$^3$. As examples, n-well region 104 may exhibit a concentration of $10^{16}$ dopant atoms/cm$^3$ or $10^{15}$ dopant atoms/cm$^3$. Devices of these types may therefore sometimes be referred to as lightly doped or "LVT" devices. Lightly doped diodes such as LVT diodes 22 may reduce the amount of majority carriers to be depleted, thereby effectively increasing Wdep and reducing the diode capacitance.

One way of forming a lightly doped n-well region 104 is to form n-well region 104 using a reduced amount of n-type dopants relative to other parts of device 10 that require standard doping profiles. Another way of forming lightly doped n-well region 104 is via counter doping.

Figure 4:
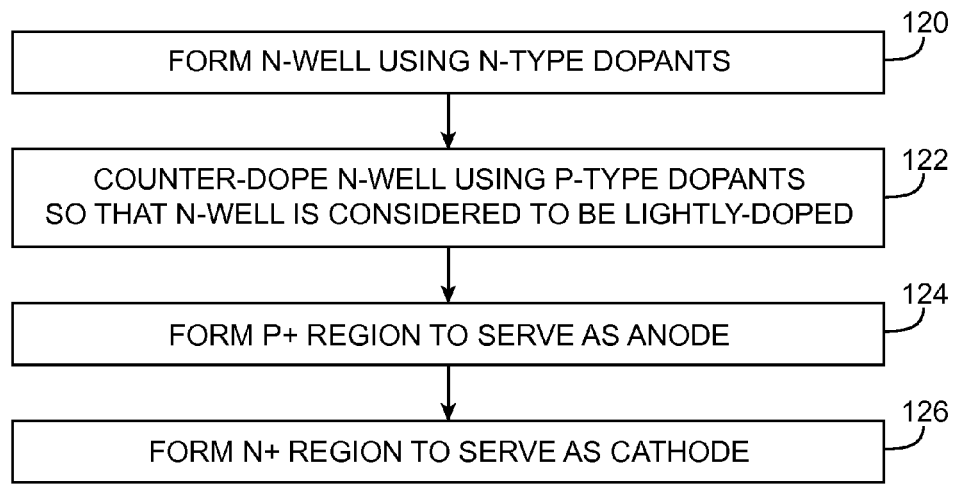
FIG. 4 is a flow chart of illustrative steps for forming the ESD diode circuit of FIG. 3 in accordance with an embodiment of the present invention.

FIG. 4 is a flow chart of illustrative steps involved in forming diode 22 using counter doping. At step 120, n-well 104 may be formed by implanting n-type dopants in selected regions over substrate 100.

At step 122, the selected regions may be counter doped using p-type dopants so that the effective n-type concentration of n-well 104 is reduced. This can be accomplished by ensuring that the amount of n-type dopants implanted during step 120 is greater than the amount of p-type dopants implanted during step 122. Regions on substrate 100 that have been counter doped may be considered to exhibit an LVT doping profile while other regions that have not been counter doped may be considered to exhibit an SVT doping profile.

At step 124, p+ region 106 may be formed to serve as the anode for diode 22. At step 126, n+ region 108 may be formed to serve as the cathode for diode 22. In general, steps 124 and 126 may be performed in any desired order. The steps of FIG. 4 are merely illustrative. If desired, other ways of forming diodes 22 with lightly doped n-wells may be used.

Figure 5:
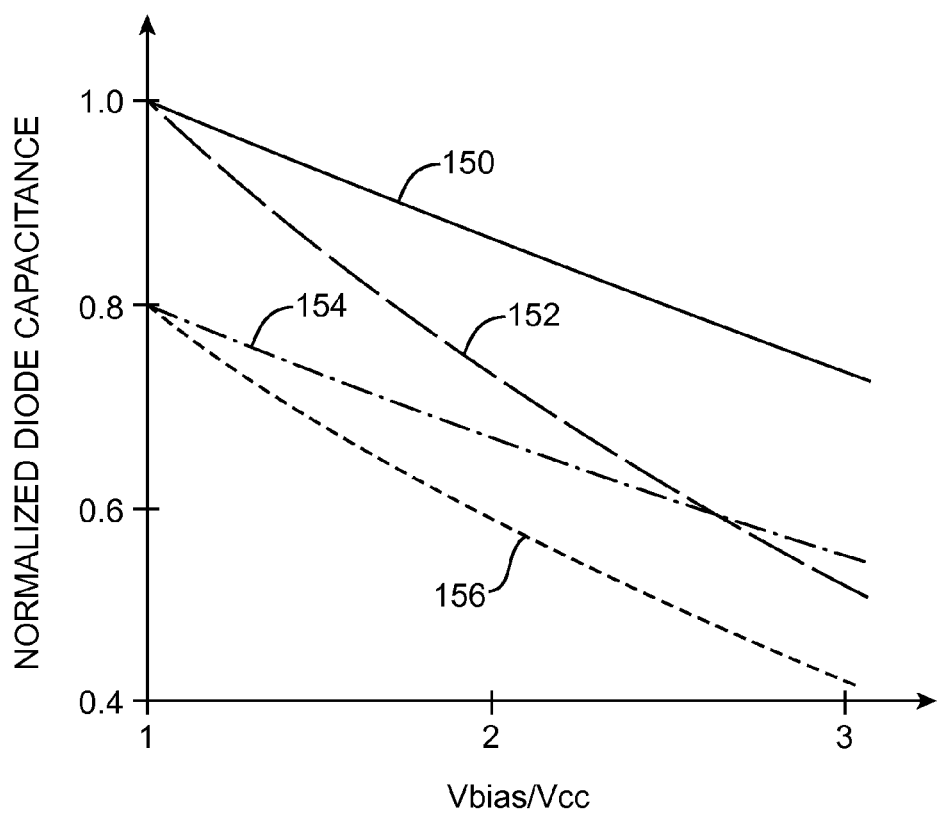
FIG. 5 is a diagram plotting normalized diode capacitance versus diode reverse bias voltage in accordance with an embodiment of the present invention.

FIG. 5 is a diagram that plots normalized diode capacitance versus normalized Vbias (e.g., Vbias/Vcc) during normal operation. Curves 150 and 152 may represent the capacitance levels for a diode with SVT doping profiles, whereas curves 154 and 156 may represent the capacitance levels for diode 22 with LVT doping profiles. As shown in FIG. 5, the amount of capacitance associated with diode 22 having lightly doped n-well 104 is less than the amount of capacitance associated with a diode having standard doped n-well. In general, diode capacitance levels decrease as the amount of reverse bias increases (e.g., curves 150, 152, 154, and 156 slope downwards with increasing levels of Vbias).

As described previously in connection with FIG. 2, signals output from buffer circuits 20 may toggle between Vcc and Vss. Curves 150 and 154 may represent the diode capacitance profile when the buffer output signals swing high (up to Vcc), whereas curves 152 and 156 may represent the diode capacitance profile when the buffer output signals swing low (down to Vss). As expected, the amount of capacitance is lower when the buffer output signals are low since the amount of reverse bias applied to diode 22 is relatively higher than when the buffer output signals are high (e.g., curve 156 sits below curve 154).

ESD current that flows through diodes 22 may be drained through power clamp 30 (see, FIG. 2). In addition to upsizing diodes 22, it may also be desirable to improve the current sinking capabilities of power clamp 30 (e.g., by reducing the on-current resistance associated with power clamp circuit 30) to improve ESD performance.

Figure 6:
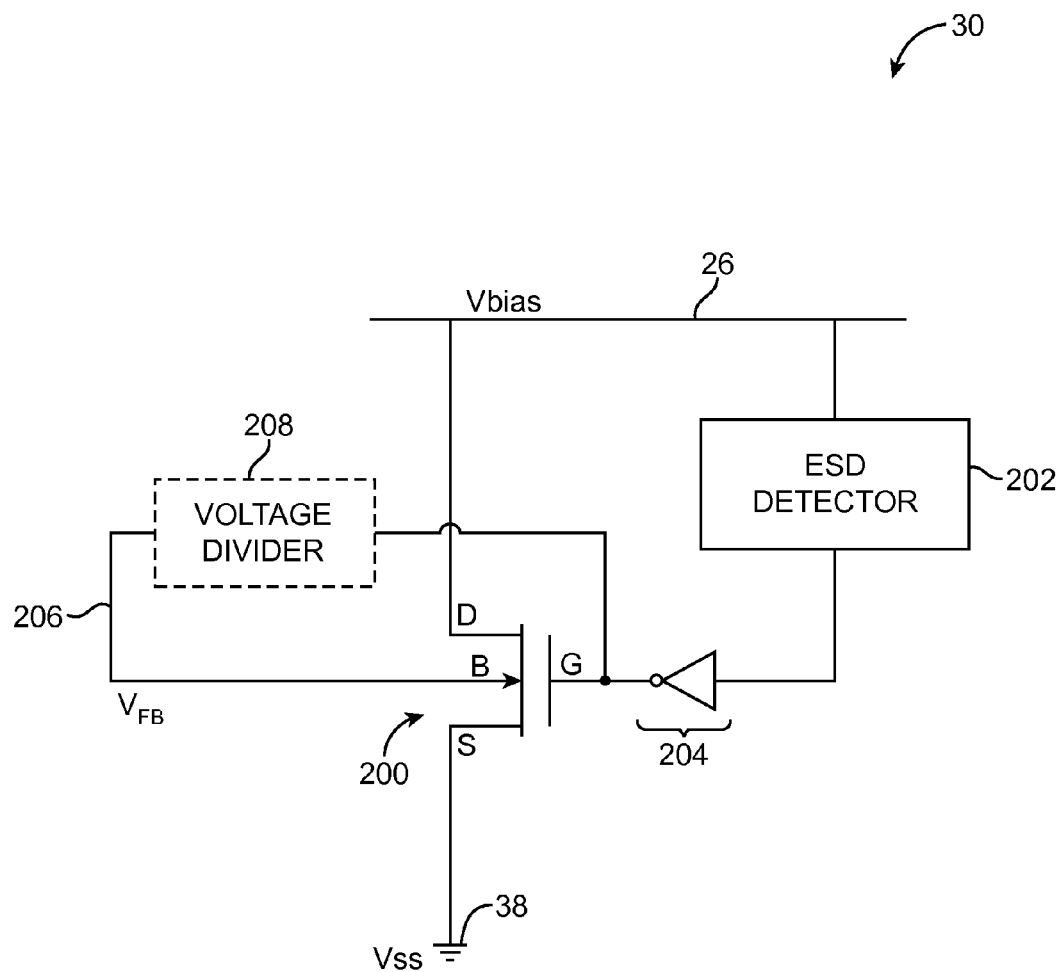
FIG. 6 is a diagram of an illustrative power clamp circuit with forward bias in accordance with an embodiment of the present invention.

FIG. 6 shows one suitable circuit implementation of power clamp 30. As shown in FIG. 6, power clamp 30 may include a switch such as transistor 200, an ESD detection circuit such as ESD detector 202, and a logic gate such as inverter 204. Transistor 200 may be an n-channel transistor having a drain terminal that is connected to ESD control line 26, a source terminal that is connected to ground power supply line 38, and a gate terminal. In certain embodiments, transistor 200 may be an LVT device having n-type source-drain regions formed in a lightly-doped p-well. Transistor 200 that is lightly doped may be formed using similar steps described in connection with FIG. 4 (e.g., by counter-doping a p-well in which the n-type source-drain regions are formed). Electrostatic discharge detector 202 may have an input that is coupled to line 26 and an output that is coupled to the gate of transistor 200 via inverter 204. Inverter 204 may be powered via control line 26 and ground line 38.

Control line 26 may be biased to voltage level Vbias during normal operation and may be floating when device 10 is powered down. During normal operation, ESD detector 202 may receive a constant high Vbias at its input (e.g., a bias signal having a voltage level greater than that of Vcc to reverse bias diodes 22) and may generate a corresponding high output signal. Inverter 204 may invert the high output signal and generate a low output signal to the gate of transistor 200 to turn off transistor 200. In other words, transistor 200 may be deactivated during normal operation of device 10.

During device manufacturing and assembly operations, device 10 is powered down and control line 26 may be floating (e.g., signal Vbias is not actively driven to any particular voltage level). During an ESD event, charge may flow through at least one of diodes 22 to rapidly charge control line 26 to a high voltage level (e.g., signal Vbias may instantaneously rise high). In such scenarios, ESD detector 202 may be configured to generate a low output signal, which will cause inverter 204 to generate a high output signal to the gate of transistor 200. As a result, transistor 200 will be turned on to drain any accumulated charge on ESD control line 26. The on resistance of transistor 200 may determine the ability with which power clamp 30 discharges current during an ESD event. In general, it may be desirable to decrease the on resistance of transistor 200 to improve ESD performance.

In one embodiment, the on resistance of transistor 200 may be reduced by increasing the size of transistor 200 (e.g., by increasing the width of transistor 200). In another embodiment, the on resistance of transistor 200 may be reduced by forward biasing the substrate of transistor 200. As shown in FIG. 6, transistor 200 may have a substrate terminal (sometimes referred to as the "bulk" or "body" terminal) that is coupled to its gate terminal via path 206. Connected in this way, the bulk (B) terminal of transistor 200 may be biased high during an ESD event to forward bias the substrate of transistor 200 (e.g., the bulk terminal of transistor 200 may receive forward biasing signal $V_{FB}$ during an ESD event).

Forward biasing transistor 200 may serve to reduce a threshold voltage associated with transistor 200, thereby reducing on current resistance (e.g., forward biasing the transistor substrate may serve to increase transistor drive strength). Transistor 200 may therefore be turned on in a forward bias configuration during ESD events and may be turned off during normal operation. If desired, a voltage control circuit such as voltage divider 208 may optionally be interposed in path 206 between the bulk and the gate of transistor 200 to adjust the amount of substrate forward bias that is applied to transistor 200.

Figure 7:
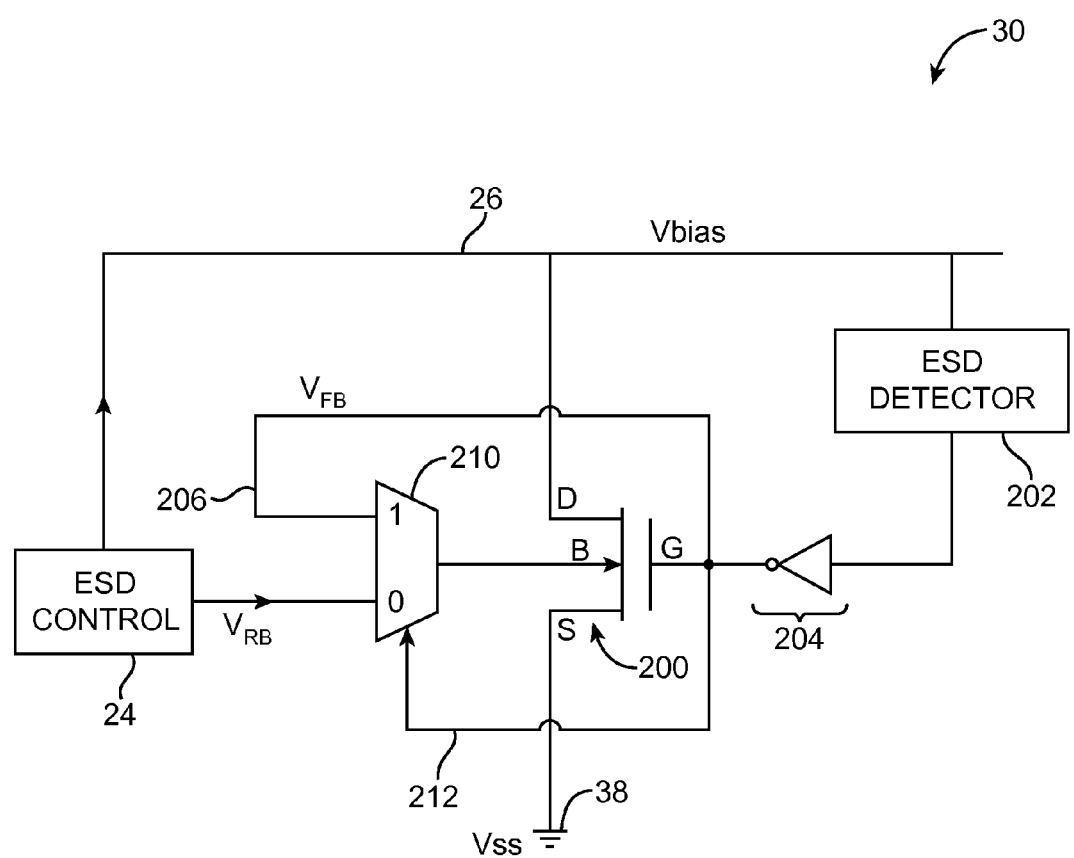
FIG. 7 is a diagram of an illustrative power clamp circuit operable in a forward bias configuration during ESD events and operable in a reverse bias configuration during normal operation in accordance with an embodiment of the present invention.

FIG. 7 shows another suitable circuit implementation of power clamp 30. Power clamp 30 may also include a multiplexing circuit such as multiplexer 210. As shown in FIG. 7, multiplexer 210 may have a first (0) input configured to receive signal $V_{RB}$ from ESD control circuit 24 during normal operation, a second (1) input configured to receive signal $V_{FB}$ from the gate of transistor 200 during an ESD event, an output that is coupled to the bulk terminal of transistor 200, and a control input that is coupled to the gate of transistor 200 via path 212.

Multiplexer 210 may be configured to route signals from a selected one of its inputs to its output. For example, multiplexer 210 may be configured to route signal $V_{RB}$ from its first input to its output when the control input of multiplexer 210 receives a low voltage and may be configured to route signal $V_{FB}$ from its second input to its output when the control input of multiplexer 210 receives a high voltage. The gate terminal of transistor 200 (and consequently the control input of multiplexer 210) may generally receive a low voltage signal during normal operation and may be pulsed high during an ESD event.

Arranged in this way, multiplexer 210 may provide forward biasing signal $V_{FB}$ to the bulk of transistor 200 to increase the drive strength of transistor 200 during an ESD event and may provide reverse biasing signal $V_{RB}$ to the bulk of transistor 200 during normal operation. Reverse biasing transistor 200 may increase the threshold voltage of transistor 200, thereby reducing transistor leakage during normal operation while transistor 200 is shut off (e.g., reverse biasing the transistor substrate may help reduce power consumption).

Figure 8:
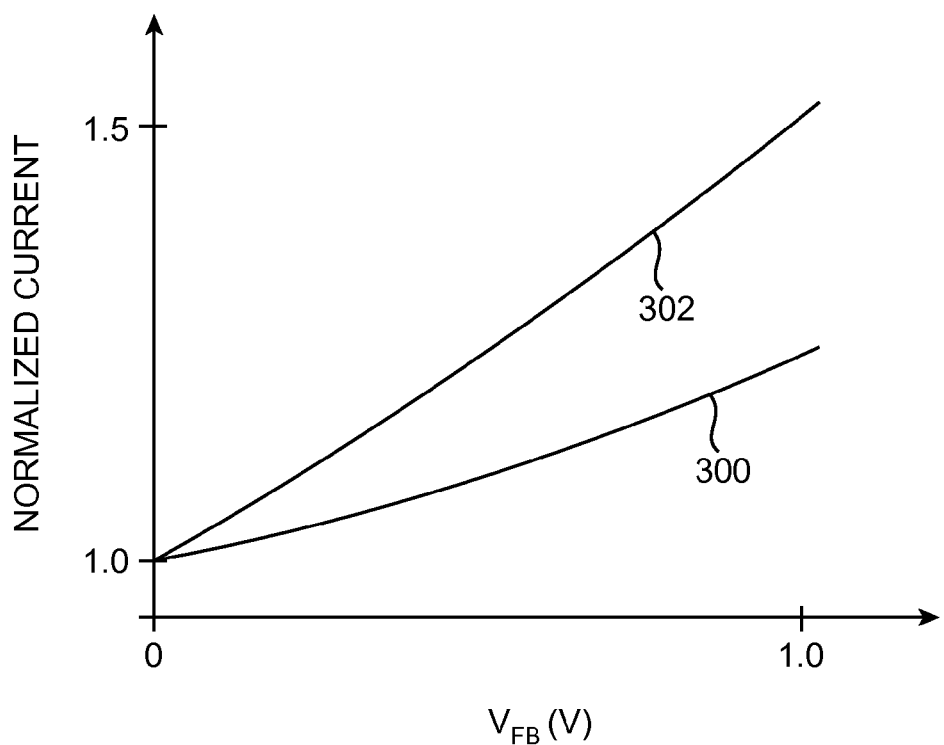
FIG. 8 is a diagram plotting normalized current versus forward bias voltage in accordance with an embodiment of the present invention.

FIG. 8 is a diagram plotting normalized transistor on current versus voltage $V_{FB}$. Curve 300 may represent the on current that flows through transistor 200 when transistor 200 is in linear mode, whereas curve 302 may represent the on current that flows through transistor 200 when transistor 200 is in saturation mode. As shown in FIG. 8, both linear current and saturation current increases when the amount of forward bias is increased (e.g., increasing the magnitude to $V_{FB}$ increases the amount of current that flows through transistor 200).

Figure 9:
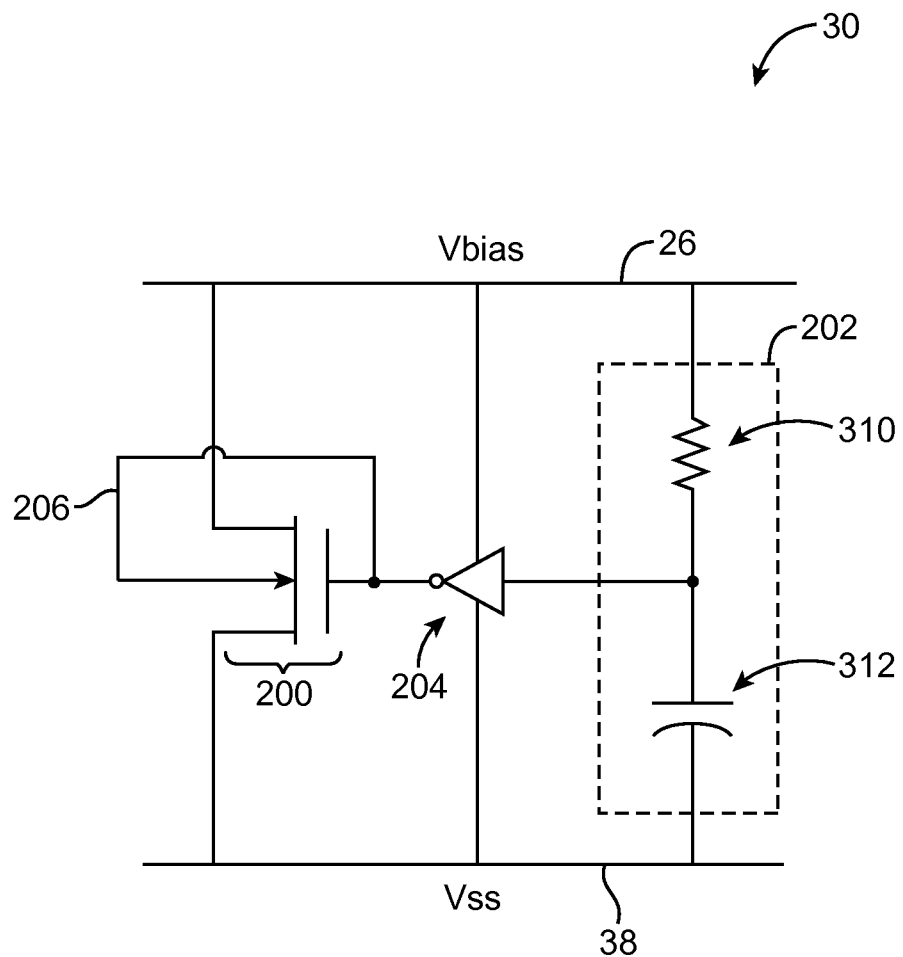
FIG. 9 is a circuit diagram of an illustrative power clamp circuit and associated ESD detection circuit implemented using a low-pass filter in accordance with an embodiment of the present invention.

FIG. 9 shows an arrangement of power clamp 30 in which ESD detector 202 is implemented using a filter circuit. As shown in FIG. 9, power clamp 30 may include a resistor 310 and a capacitor 312 coupled in series between ESD control line 26 and ground power supply line 38. The input of inverter 204 may be coupled to an intermediate node at which resistor 310 and capacitor 312 are connected. Inverter 204 may have a positive power supply terminal that is coupled to ESD control line 26 and a ground power supply terminal that is coupled to ground line 38. ESD detector 202 of FIG. 9 may be a low pass filter circuit. This is merely illustrative. Other ways of implementing a low pass filter may be used. If desired, ESD detector 202 may be implemented using other types of circuits that turns on transistor 200 in response to an ESD event and that turns off transistor 200 during normal operation.

As described previously, signal Vbias may be driven to a boosted/elevated voltage level that is greater than Vcc to reverse bias diode circuits 22 during normal operation. When Vbias is substantially greater than Vcc (e.g., if Vbias is more than 25% greater than Vcc), it may be desirable to implement stacked power clamps to prevent transistor 200 from experiencing oxide breakdown or other device reliability issues.

Figure 10A:
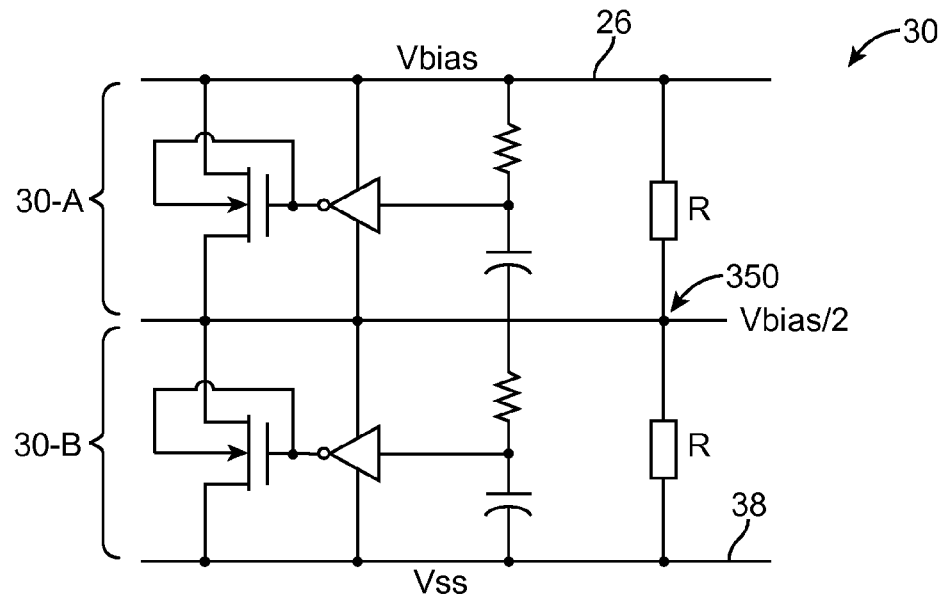
FIGS. 10A and 10B are circuit diagrams of illustrative power clamp circuits configured in a stacked arrangement in accordance with an embodiment of the present invention.

FIG. 10A is a circuit diagram showing power clamp 30 configured in a two-stack configuration. As shown in FIG. 10A, a resistive ladder with first and second resistive loads each having identical resistance values R may be coupled between ESD control line 26 and ground line 38. The resistive ladder may serve to divide the voltage difference between lines 26 and 38 into two equal parts (e.g., so that an intermediate node 350 between the two resistive loads has a voltage level of Vbias/2). Dividing down the voltage in this way ensures that the voltage drop across each power clamp portion satisfies device reliability criteria. A first power clamp portion 30-A may be coupled in parallel with the first resistive load, whereas a second power clamp portion 30-B may be coupled in parallel with the second resistive load. Each of portions 30-A and 30-B may be formed using power clamp configurations of the types described in at least FIG. 6 or 7. The two-stack power clamp configuration may be suitable for handling Vbias of up to 2 V (as an example).

Figure 10B:
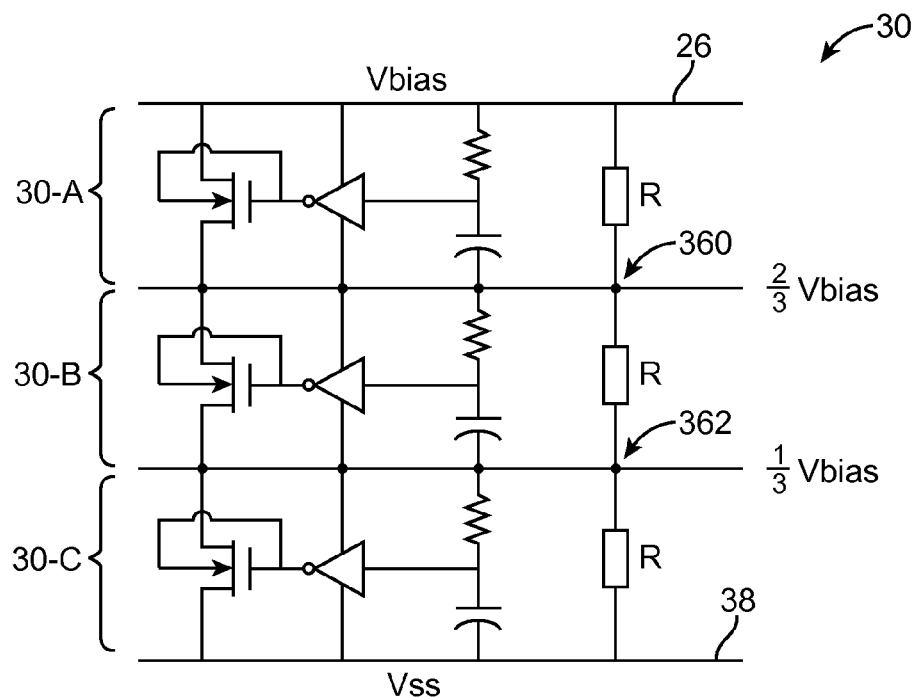

FIG. 10B is a circuit diagram showing power clamp 30 configured in a triple-stack configuration. As shown in FIG. 10B, a resistive ladder with first, second, and third resistive loads each having identical resistance values R may be coupled between ESD control line 26 and ground line 38. The resistive ladder may serve to divide the voltage difference between lines 26 and 38 into three equal parts (e.g., so that a first intermediate node 360 between the first and second resistive loads has a voltage level of Vbias*⅔ and so that a second intermediate node 362 between the second and third resistive loads has a voltage level of Vbias/3). A first power clamp portion 30-A may be coupled in parallel with the first resistive load; a second power clamp portion 30-B may be coupled in parallel with the second resistive load; and a third power clamp portion 30-C may be coupled in parallel with the third resistive load. Each of portions 30-A, 30-B, and 30-C may be formed using power clamp configurations of the types described in at least FIG. 6 or 7. The triple-stack power clamp configuration may be suitable for handling Vbias of up to 3 V (as an example).

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
   a first power supply line on which a first power supply voltage is provided;
   a second power supply line on which a second power supply voltage is provided;
   a buffer circuit having a first power supply terminal that is coupled to the first power supply line and a second power supply terminal that is coupled to the second power supply line, wherein the buffer circuit is formed in at least a first well of a first dopant concentration of a first dopant type;
   an electrostatic discharge diode circuit having a first terminal that is coupled to the buffer circuit and a second terminal that receives a bias voltage is that greater than the first and second power supply voltages, wherein the first and the second terminals are formed in a second well of a second dopant concentration of the first dopant type that is lowered from a third dopant concentration of the first dopant type by dopant implantation of a second dopant type that is different from the first dopant type; and
   a transistor that is coupled to the electrostatic discharge diode circuit, wherein the transistor is formed in a third well of a fourth dopant concentration of the second dopant type that is lowered from a fifth dopant concentration of the second dopant type by dopant implantation of the first dopant type.

2. The integrated circuit defined in claim 1, further comprising:
   an input-output pad that is coupled to the buffer circuit.

3. The integrated circuit defined in claim 1, further comprising:
   an electrostatic discharge control circuit that supplies the bias voltage to the electrostatic discharge diode circuit.

4. The integrated circuit defined in claim 1, further comprising:
   an electrostatic discharge power clamp circuit coupled between the electrostatic discharge diode circuit and the second power supply line, wherein the electrostatic discharge power clamp circuit includes the transistor that is coupled to the electrostatic discharge diode circuit.

5. The integrated circuit defined in claim 4, wherein the transistor in the electrostatic discharge power clamp circuit has a bulk terminal that is forward biased when the transistor is turned on.

6. The integrated circuit defined in claim 4, wherein the transistor in the electrostatic discharge power clamp circuit has a bulk terminal that is reverse biased when the transistor is turned off.

7. The integrated circuit defined in claim 4, wherein the electrostatic discharge power clamp circuit further includes an electrostatic discharge detection circuit, and wherein the electrostatic discharge detection circuit is configured to turn on the transistor during an electrostatic discharge event and to turn off the transistor during normal operation of the integrated circuit.

8. An integrated circuit, comprising:
   processing circuitry that includes transistors formed in at least a first well having a first doping concentration of a first type of dopants; and
   electrostatic discharge protection circuitry that includes:
      a first circuit formed in a second well having a second doping concentration of the first type of dopants that is reduced from a third doping concentration of the first type of dopants via dopant implantation of a second type of dopants that is different from the first type of dopants; and
      a second circuit formed in a third well having a fourth doping concentration of the second type of dopants that is reduced from a fifth doping concentration of the second type of dopants via dopant implantation of the first type of dopants.

9. The integrated circuit defined in claim 8, wherein the first circuit comprises an electrostatic discharge diode circuit.

10. The integrated circuit defined in claim 9, further comprising:
   at least one input-output pad;
   an input-output buffer circuit that is coupled to the input-output pad; and
   a control circuit, wherein the electrostatic discharge diode circuit is coupled between the at least one input-output pad and the control circuit.

11. The integrated circuit defined in claim 10, further comprising:
   first and second power supply lines through which first and second power supply voltages are supplied to the input-output buffer circuit, wherein the control circuit is configured to provide a bias voltage that is greater than the first and second power supply voltages to the electrostatic discharge diode circuit.

12. The integrated circuit defined in claim 8, wherein the second circuit comprises an n-channel transistor.

13. The integrated circuit defined in claim 12, wherein the electrostatic discharge protection circuitry further includes an electrostatic discharge detection circuit configured to turn on the n-channel transistor in response to detecting an electrostatic discharge event and to turn off the n-channel transistor during normal operation of the integrated circuit.

14. The integrated circuit defined in claim 12, wherein the electrostatic discharge protection circuitry further includes a multiplexing circuit that is configured to provide a forward biasing voltage signal to a bulk terminal of the n-channel transistor during an electrostatic discharge event and that is configured to provide a reverse biasing voltage signal to the bulk terminal of the n-channel transistor during normal operation of the integrated circuit.

15. The integrated circuit defined in claim 12, wherein the n-channel transistor has a bulk terminal and a gate terminal, and wherein the electrostatic discharge protection circuitry further includes a voltage divider circuit coupled between the bulk terminal and the gate terminal of the n-channel transistor.

16. A method of forming an integrated circuit, comprising:
   forming processing circuitry that includes transistors formed in a first well having a first dopant concentration of a first type of dopants; and
   forming electrostatic discharge protection circuitry by:
      forming isolation structures in a substrate;
      forming a second well between the isolation structures in the substrate, wherein the second well exhibits a second dopant concentration of a second type of dopants that is different from the first type of dopants;
      forming a third well in the substrate, wherein the third well exhibits a third concentration of the first type of dopants;
      reducing the second dopant concentration of the second well by implanting dopants of the first type in the second well;
      reducing the third concentration of the third well by implanting dopants of the second type in the third well; and
      forming contact regions within the second well.

17. The method defined in claim 16, wherein forming the second well comprises:
   forming an n-well for an electrostatic discharge diode.

18. The method defined in claim 16, wherein forming the third well comprises:
   forming a p-well for an n-channel transistor.

19. The method defined in claim 18, wherein the n-channel transistor has a gate terminal and a bulk terminal, the method further comprising:
   forming a path that couples the gate terminal to the bulk terminal of the n-channel transistor.

20. The method defined in claim 19, further comprising:
   forming a multiplexing circuit that is interposed in the path that couples the gate terminal to the bulk terminal of the n-channel transistor.

* * * * *